US006643434B2

(12) United States Patent
Cayrefourcq et al.

(10) Patent No.: US 6,643,434 B2
(45) Date of Patent: Nov. 4, 2003

(54) PASSIVE ALIGNMENT USING SLANTED WALL PEDESTAL

(75) Inventors: Ian Cayrefourcq, Paris (FR); Chandrasekhar Pusarla, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 198 days.

(21) Appl. No.: 09/764,839

(22) Filed: Jan. 17, 2001

(65) Prior Publication Data

US 2001/0010743 A1 Aug. 2, 2001

(30) Foreign Application Priority Data

Feb. 2, 2000 (EP) .............................................. 00400283

(51) Int. Cl.⁷ ................................................ G02B 6/00
(52) U.S. Cl. ........................................ 385/52; 257/777
(58) Field of Search ............................ 385/52, 14, 88; 257/777, 797

(56) References Cited

U.S. PATENT DOCUMENTS

| 4,542,397 A | * | 9/1985 | Biegelsen et al. | |
|---|---|---|---|---|
| 4,949,148 A | | 8/1990 | Bartelink | |
| 5,077,878 A | | 1/1992 | Armiento et al. | |
| 5,182,782 A | | 1/1993 | Tabasky et al. | |
| 5,214,308 A | | 5/1993 | Nishiguchi et al. | 257/692 |
| 5,321,786 A | | 6/1994 | Valette et al. | 385/92 |
| 5,499,312 A | | 3/1996 | Hahn et al. | 385/91 |
| 5,656,507 A | | 8/1997 | Welbourn et al. | 385/14 |
| 5,801,452 A | | 9/1998 | Farnworth et al. | 257/797 |
| 5,998,868 A | | 12/1999 | Pogge et al. | 257/730 |
| 6,114,221 A | * | 9/2000 | Tonti et al. | 438/455 |
| 6,188,138 B1 | | 2/2001 | Bodö et al. | 257/778 |
| 6,198,172 B1 | | 3/2001 | King et al. | 257/797 |
| 6,459,158 B1 | * | 10/2002 | Delprat et al. | 257/777 |

FOREIGN PATENT DOCUMENTS

| DE | 19644758 | 4/1998 |
|---|---|---|
| EP | 0312217 A1 | 4/1989 |
| EP | 0 723 171 A2 | 7/1996 |
| WO | WO 98/19194 | 5/1998 |

OTHER PUBLICATIONS

J.P. Hall et al., "Packaging of VCSEL, MC–LED and Detector 2–D Arrays", IEEE 1998 Electronic Components and Technology Conference, pp. 778–782.

* cited by examiner

Primary Examiner—Akm Enayet Ullah
Assistant Examiner—Mike Stahl
(74) Attorney, Agent, or Firm—Juliana Agon

(57) ABSTRACT

An apparatus is provided including a first chip having a plurality of solder bumps and recesses formed therein at preselected locations. A second chip is provided with a plurality of solder pads and projections. A plurality of solder bonds are coupled between the first and second chips. At least one of the recesses and projections includes angled walls for capturing and directing the other during reflow of the solder bonds such that the first chip aligns relative to the second chip under the surface tension of the solder bonds. If desired, vibrating waves may be applied to the first and second chips during reflow to assist movement of the projections relative to the recesses.

18 Claims, 6 Drawing Sheets

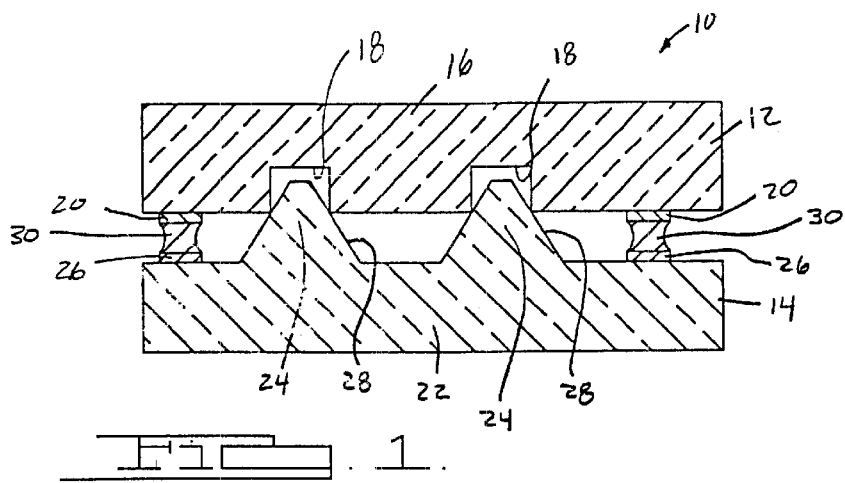
FIG. 1.
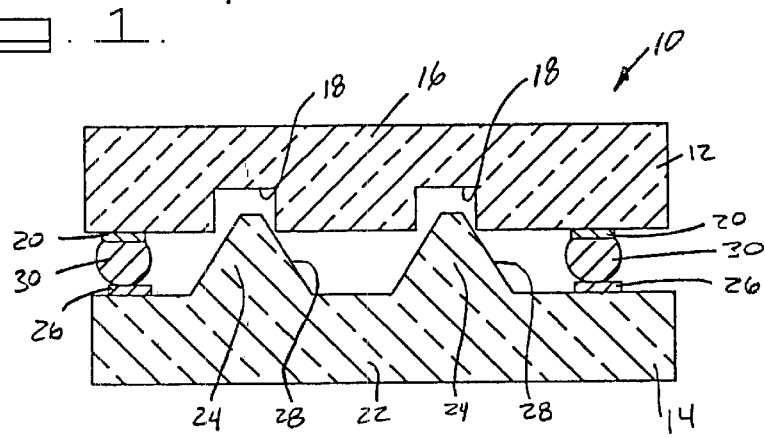
FIG. 2.
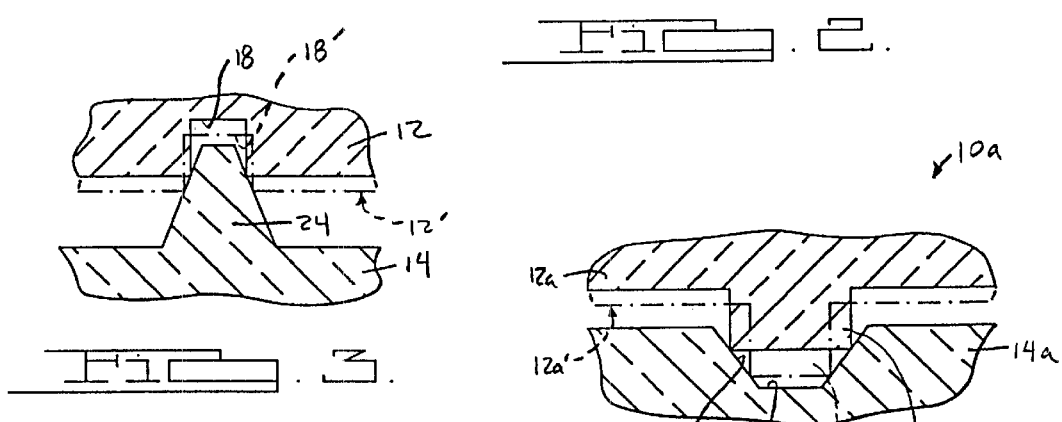
FIG. 3.
FIG. 4.
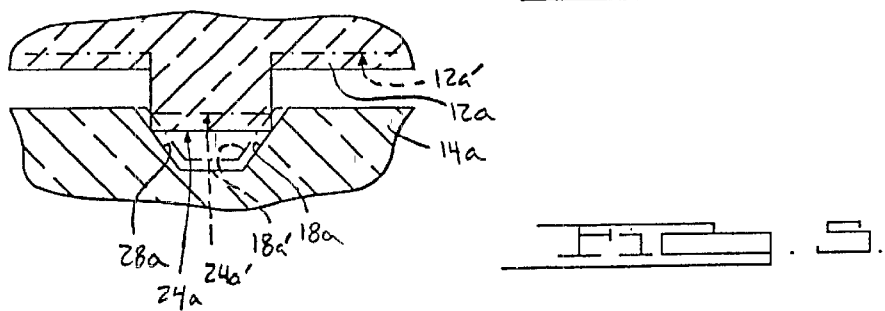
FIG. 5.

PASSIVE ALIGNMENT USING SLANTED WALL PEDESTAL

CROSS REFERENCE TO RELATED APPLICATIONS

This application claims the benefit of European Application No. 00400283.8, filed Feb. 10, 2000.

BACKGROUND OF THE INVENTION

1. Technical Field

The present invention generally relates to optoelectronic/photonic devices and, more particularly, to a method and apparatus for passively aligning, tacking, and bonding an optoelectronic/photonic device with a matching substrate.

2. Discussion

Photonic component hybridization concerns integrating optical components on a substrate with optoelectronic/photonic devices. This technology involves electrically and mechanically bonding the optoelectronic/photonic device with the optical components (e.g. wave guides, gratings, etc.) on the substrate. A fundamental issue in photonic component hybridization is the accurate positioning of the device relative to the substrate. Attempts to ensure such positioning accuracy include active and passive alignment techniques.

A widely used passive alignment technique involves the use of flip-chip solder bonding. U.S. Pat. No. 5,499,312 discloses a method for passive alignment and packaging of optoelectronic components to optical wave guides using flip-chip bonding technology. This method completely relies on the solder surface tension and the design of the wettable pads to align the wave guides to the optoelectronic components. In this bonding sequence, a chip (e.g., the device) with a plurality of solder bumps formed thereon is roughly aligned over a substrate using a pick and place machine, the temperature of the assembly is then raised above the solder melting temperature, and, upon the solder melting, surface tension appears at all interfaces which moves the chip to the lowest potential energy point which corresponds to alignment with the substrate. Once the chip is aligned, the solder is cooled.

Tests have shown that such passive alignment techniques range in accuracy from a submicron level to more than 10 microns due to variations in the solder bonding process. Current accuracy requirements for photonic component hybridization is about 0.5 micrometers in the X, Y, and Z directions. As such, the uncertainty in alignment accuracy of this technique makes it unsuitable for photonic assemblies.

To eliminate the dependency of alignment accuracy on the solder bonding process, several techniques employing stops and standoffs have been employed. For example, German Patent No. 19 644 758 A1 discloses a technique wherein the chip to be attached has projections that are inserted into recesses on the substrate in a precisely fitted fashion. The dimensional accuracy of the projections and the recesses is determined either by lithography or by micro-milling or micro-drilling tolerances, typically less than one micrometer.

Another exemplary passive alignment technique is disclosed in U.S. Pat. No. 5,077,878. In this technique, two front pedestals and one side pedestal are provided on the surface of one chip and a vertical side wall is provided on the other chip. When mounted, the front face of the second chip contacts the two front pedestals of the first chip and the side wall of the second chip mates with the side pedestal of the first chip. This theoretically precisely aligns the two chips.

While tests have shown that some very good results can be obtained with the above techniques, results still depend upon the frictional forces between the stops on one chip and the edges or recesses in the other chip. This is a severe drawback for mass production. To overcome this drawback, some manufacturers have employed active alignment techniques.

One type of active alignment technique uses a flip-chip machine which yields very precise and accurate placement. Active alignment using commercially available flip-chip machines demonstrate accuracy tolerances of about 0.5 micrometers. However, such flip-chip machines are very expensive. As such, this active alignment technique is not cost-effective. In addition to the machine price, using such a machine does not allow multiple chip bonding. This results in a very slow production rate. Manufacturing process using such a machine are not only expensive but also very slow.

In view of the foregoing, it would be desirable to provide a method and apparatus for aligning and bonding a chip to a substrate which overcomes the drawbacks of the prior art.

SUMMARY OF THE INVENTION

The above and other objects are obtained by providing a first chip with a plurality of solder bumps and a plurality of recesses at preselected locations relative to the plurality of solder bumps. A second chip is provided with a plurality of solder pads and a plurality of projections at preselected locations relative to the plurality of solder pads. A plurality of solder bonds are coupled between at least one of the plurality of solder bumps and the plurality of solder pads, and the plurality of projections and the plurality of recesses. At least one of the plurality of recesses and the plurality of projections includes angled walls for capturing and directing the other of the plurality of recesses and the plurality of projections during reflow of the solder bonds such that the first chip aligns relative to the second chip under the surface tension of the solder bonds. According to another aspect of the present invention, vibrating waves are applied to the first and second chips during reflow to assist movement of the plurality of projections relative to the plurality of recesses.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which:

FIG. 1 is a side elevational view of a passively aligned, tacked, and bonded optoelectronic/photonic device and matching substrate according to the present invention;

FIG. 2 is a side elevational view of the device and substrate of FIG. 1 after prealignment but before bonding;

FIG. 3 is a side elevational view of a projection on the substrate engaging alternate embodiment recesses of the device;

FIG. 4 is a side elevational view illustrating alternate embodiment projection on the device engaging a slanted wall recess of the substrate;

FIG. 5 is a side elevational view illustrating a projection of the device engaging alternate embodiment recesses of the substrate;

DETAILED DESCRIPTION OF THE PREFERRED EMBODIMENTS

Figure 6A:
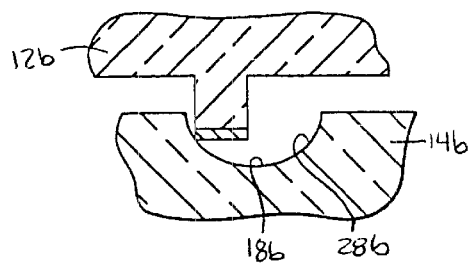
FIGS. 6a–6b illustrate a projection of the device entering an alternate embodiment recess of the substrate.

The present invention is directed towards a method and apparatus for mechanically and electrically interconnecting an optoelectronic device with a substrate supporting optical components thereon. In accordance with the teachings of the present invention, at least one of a plurality of projections and a plurality of recesses formed on the device and/or the substrate includes angled walls for capturing and directing the other of the plurality of recesses and the plurality of projections such that the device aligns relative to the substrate during reflow of interconnecting solder bonds. In accordance with another aspect of the present invention, vibrating waves are applied to the device and substrate to assist alignment of the projections relative to the recesses.

Turning now to the drawing figures, FIG. 1 illustrates an apparatus 10 assembled in accordance with the teachings of the present invention. The apparatus 10 includes a first chip in the form of an optoelectronic/photonic device 12 disposed opposite a second chip in the form of an optical component supporting substrate 14. The device 12 includes a body 16 having a plurality of recesses 18 formed therein. The recesses 18 are preferably formed at pre-selected locations relative to a plurality of bonding or solder bumps 20 coupled to the body 16.

The substrate 14 includes a base 22 having a plurality of projections 24 extending therefrom. The projections 24 are preferably located at pre-selected locations relative to a plurality of bonding or solder pads 26 coupled to the base 22. The number and locations of projections 24 are selected to match the number and location of the recesses 18 in the device 12. The projections 24 include angled walls 28 for engaging the device 12 adjacent the recesses 18. The orientation of the device 12 relative to the substrate 14 is controlled by varying the pitch of the angled walls 28 and/or the dimensions of the recesses 18.

A bonding member in the form of a solder bond 30 is coupled between each of the solder bumps 20 and solder pads 26 to interconnect the device 12 and substrate 14. As will be described in greater detail below, the surface tension of the solder bonds 30 is used during reflow to move the device 12 relative to the substrate 14 while alignment of the device 12 relative to the substrate 14 is controlled by the interaction of the projections 24 with the device 12 adjacent the recesses 18.

Referring now to FIG. 2, a method of mechanically and electrically interconnecting the device 12 with the substrate 14 will be described. The device 12 is provided with the plurality of recesses 18 preferably by dry-etching techniques. The diameter of the recesses 18 is dependent on the photolithography and etch parameters. Anisotropic etching of the device 12 combined with high accuracy lithography is preferred to achieve precise formation of the recesses 18.

The solder bumps 20 are then coupled to the device 12. The under bump metallurgy and the solder bumps 20 can be fabricated using a variety of techniques. For example, the solder bumps 20 can be deposited using electroplating, thermal evaporation, stencil printing, or solder jetting. The under bump metallurgy is preferably formed using a combination of photolithography and evaporation/electroplating.

The projections 24 are formed on the substrate 14 by either wet or dry etching techniques. The selection of the material for the substrate 14 is very important for achieving the desired geometry. Precisely formed, slanted projections 24 have been achieved in a substrate 14 made of silicon using wet etching techniques. The angle of the projections 24 is controlled by the crystalline structure of the silicon and is not dependent on the etch process.

The solder pads 26 are then coupled to the substrate 14. The solder pads 26 can be deposited using electroplating, thermal evaporation, stencil printing or solder jetting among other techniques. The under bump metallurgy can be formed using a combination of photolithography and evaporation/electroplating.

The placement of the projections 24 on the substrate 14 and the recesses 18 on the device 12 with respect to the solder bumps 20 and solder pads 26 is arbitrary. However, the number of projections 24 and recesses 18 is preferably optimized so that friction between the projections 24 and the device 12 adjacent the recesses 18 does not interfere with the vertical and horizontal surface tension restoring forces of the solder bonds 30.

The assembly sequence involves positioning the device 12 on the substrate 14 such that the solder bonds 30 are interposed between the solder bumps 20 and solder pads 26. If desired, heat and pressure can be applied for a short period of time at this point for tacking the device 12 to the substrate 14 via the solder bond 30. Due to the geometry of the device 12 and substrate 14, the projections 24 should now roughly align with the recesses 18. A pick and place machine is preferably employed for the above described initial placement process.

After the device 12 is positioned over the substrate 14, the apparatus 10 is subjected to a reflow cycle. During the reflow cycle, the solder bond 30 melts allowing the apparatus 10 to collapse in height. During the collapse, the projections 24 engage the device 12 adjacent the recesses 18 and guide the movement of the device 12 relative to the substrate 14. The geometry of the projections 24 and recesses 18 define the alignment accuracy of the device 12 relative to the substrate 14.

In a high volume manufacturing environment, a pick and place machine is used to initially position the device 12 on the substrate 14. The apparatus 10 is then transferred to a conventional reflow oven to melt the solder bond 30. It is very important that the device 12 stay in place relative to the substrate 14 during the transfer between the pick and place machine and the reflow oven and also through the initial stages of reflow. The above described geometry locks and tacks the device 12 in place relative to the substrate 14 during these stages without the need for flux or any organic or inorganic tacking material. Further, movement of the device 12 relative to the substrate 14 during reflow is constrained by the interaction of the projections 24 and recesses 18.

The geometry of the projections 24 including height and angle, the geometry of the under bump metallurgy, and the diameter of the recess 18 results in the hourglass-shaped (i.e. concave) solder bond 30 illustrated in FIG. 1. This shape results in a higher low cycle thermal fatigue life of the solder bond 30. Also, for a given volume of solder material and diameter of the under bump metallurgy, the solder bond 30 has more surface area which results in a large restoring force during reflow.

Referring now to FIG. 3, a more detailed view of the projection 24 and recess 18 is illustrated. An alternate embodiment recess 18' has also been illustrated in phantom. The X, Y, and Z alignment of the device 12 relative to the substrate 14 is controlled by the configuration of the projections 24 on the substrate 14 and the recesses 18 of the device 12. The larger recess 18' allows the device 12' to be positioned closer to the substrate 14 than the recess 18 of the device 12. However, the conical shape of the projection 24 and the cylindrical shape of the recesses 18 and 18' maintain a constant orientation of the device 12 relative to the substrate 14 in the X and Y directions. Advantageously, an incorrectly sized recess 18 results in misalignment in the Z direction only and no misalignment in the X and Y directions.

Turning now to FIG. 4, an alternate embodiment apparatus 10a is illustrated. In this embodiment, the device 12a is provided with a cylindrical projection 24a while the substrate 14a is provided with a conical recess 18a. The angled walls 28a of the recess 18a enable the alignment of the device 12a to the substrate 14a to be nearly insensitive to the width and height of the projections 24a as illustrated by the alternate projection 24a' of the device 12a' shown in phantom.

As shown in FIG. 5, the angled walls 28a also render the alignment of the device 12a relative to the substrate 14a insensitive to width and height variations of the recess 18a as illustrated by the alternate embodiment recess 18a' which orients the device 12 as illustrated in phantom and indicated with the reference numeral 12a'.

Figure 6B:
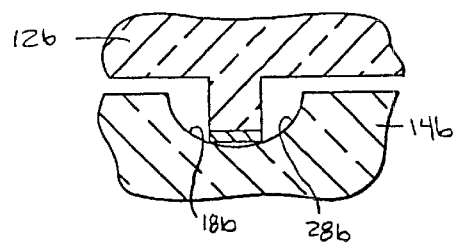

Turning now to FIGS. 6a and 6b, another alternate embodiment recess 18b is illustrated. The main purpose of the recess 18b is to allow rough prealignment of the device 12b relative to the substrate 14b. Alternate recess configurations characterized by non-vertical walls provide this function. As such, the angled wall 28b can be made arcuate such that a spherically shaped recess 18b is provided. This type of recess may be particularly well-suited for formation in a substrate 14b formed of amorphous material by wet or dry etching.

Figure 7A:
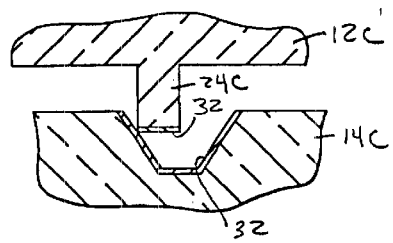
FIGS. 7a–7c illustrate a projection of the device entering a recess of the substrate with the assistance of vibrating waves.
Figure 7B:
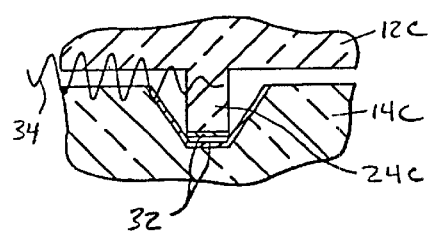
Figure 7C:
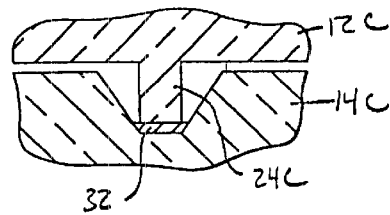

Turning now to FIGS. 7a–7c, an alternate method of aligning the device 12c relative to the substrate 14c is illustrated. The method is substantially similar to that described above with reference to FIGS. 1 and 2 and therefore the description of the similar steps will not be repeated herein. According to this method, solder 32 is disposed along the projection 24c and along the substrate 14c within the recess 18c. The device 12c is then roughly aligned relative to the substrate 14c. Vibrating waves 34 are then applied such that the device 12c and substrate 14c move relative to one another. With the assistance of gravity, the projection 24c falls into the recess 18c. A thermal cycle is then applied to melt the solder 32 such that a bond is formed between the device 12c and substrate 14c. Preferably, the vibrating waves take the form of acoustic or ultra-sonic waves and have a frequency and amplitude corresponding to the geometry of the device 12c and substrate 14c.

The vibrating waves 34 are preferably provided by an ultrasonic generator associated with a reflow oven. Such an oven can handle many components at a single time making it compatible with mass production. Further, using the vibrating waves 34 allows control over the intensity and wave form of the force that induces alignment. This enable optimization of the alignment process which improves yield.

Figure 8A:
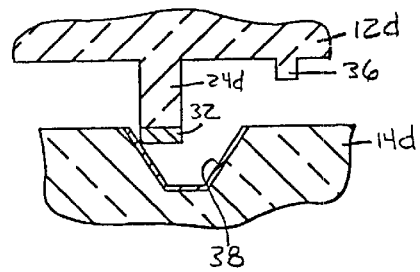
FIGS. 8a–8c illustrate a projection of an alternate embodiment device entering a recess of the substrate with the assistance of vibrating waves and a wetting material.
Figure 8B:
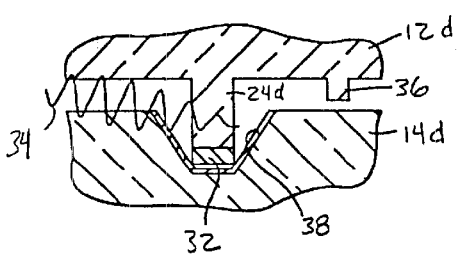
Figure 8C:
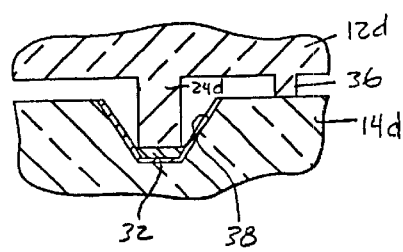

Turning now to FIGS. 8a–8c, another alternate embodiment method of aligning the device 12d relative to the substrate 14d is illustrated. In this embodiment, the device 12d is provided with an electrical pad 36. Further, a wetting material 38 is disposed on the substrate 14d within the recess 18d. The wetting material 38 controls alignment of the device 12d relative to the substrate 14d in the Z direction. This is due to the similarity of surface tension to VWA-FC technology. When the solder 32 on the projection 24d melts, the solder 32 wets the wetting material 38 thereby inducing a vertical force. The wetting material 38 is large enough such that the vertical force pulls downward on the device 12d towards the substrate 14d. If desired, alignment can be aided with the use of vibrating waves 34. Upon proper alignment, the electrical pad 36 contacts the substrate 14d.

Figure 9A:
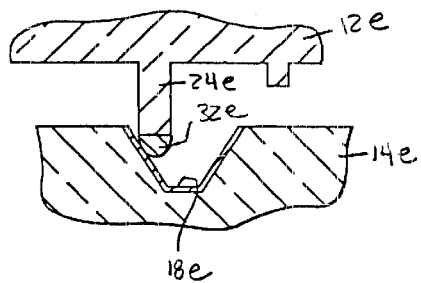
FIGS. 9a–9c illustrate a projection of the device with a solder ball deposited thereon entering a recess of the substrate.
Figure 9B:
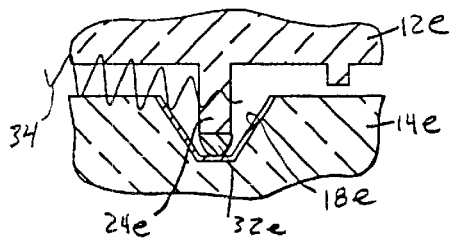
Figure 9C:
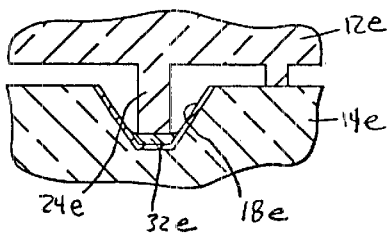

Turning now to FIGS. 9a–9c, yet another method of aligning the device 12e relative to the substrate 14e is illustrated. In this embodiment, the solder 32e deposited on the projection 24e is subjected to a reflow process in order to yield a solder ball. This spherical shape of the solder ball 32e lowers friction between the device 12e within the recess 18e and the projection 24e. This increases the alignment efficiency of the vibrating waves 34. Further, the increased height of solder ball 32e as compared to a non-spherically shaped solder bond, increases the possible excursion in the Z direction. This leads to a more effective alignment in the Z direction.

Figure 10A:
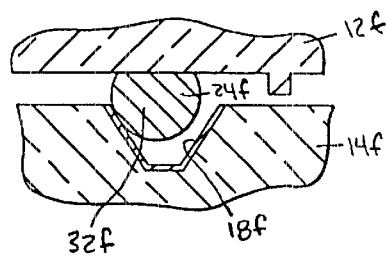
FIGS. 10a–10c illustrate a projection of the device in the form of an enlarged solder ball entering a recess of the substrate.
Figure 10B:
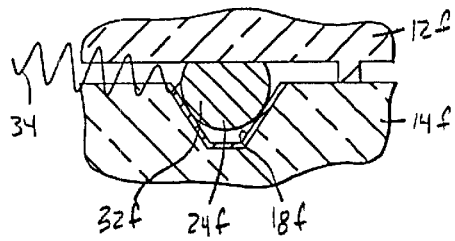
Figure 10C:
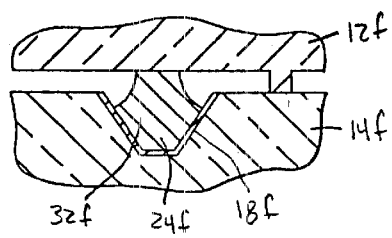
Figure 11A:
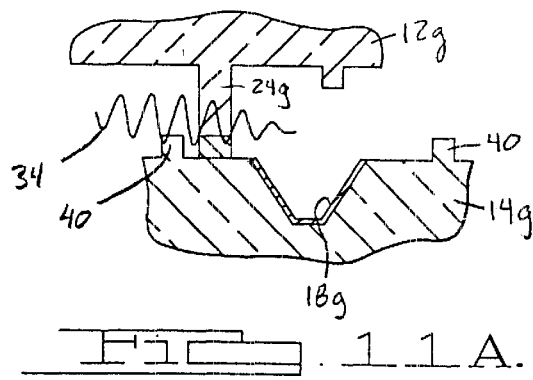
FIGS. 11a–11f illustrate a projection of the device entering a recess of the substrate with the assistance of vibrating waves and a mechanical stop.
Figure 11B:
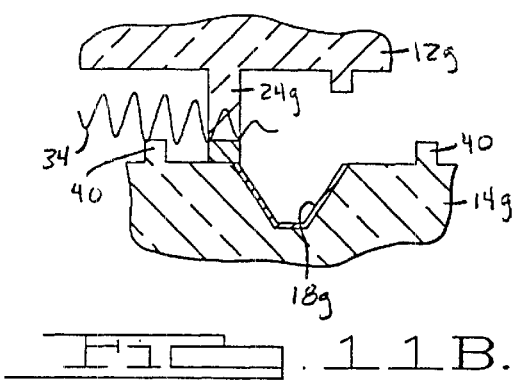
Figure 11C:
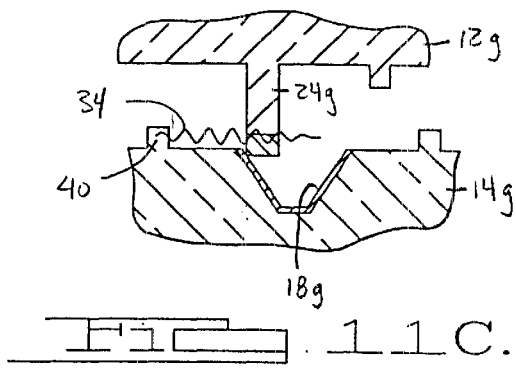
Figure 11D:
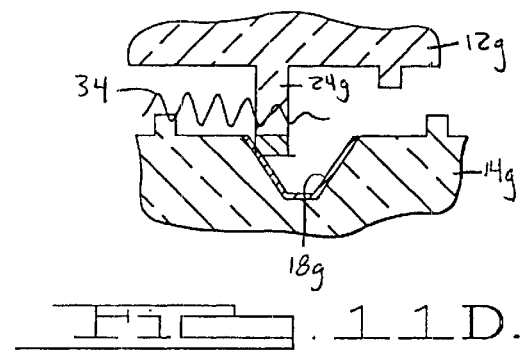
Figure 11E:
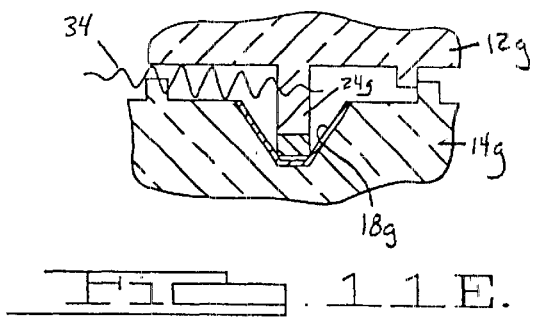
Figure 11F:
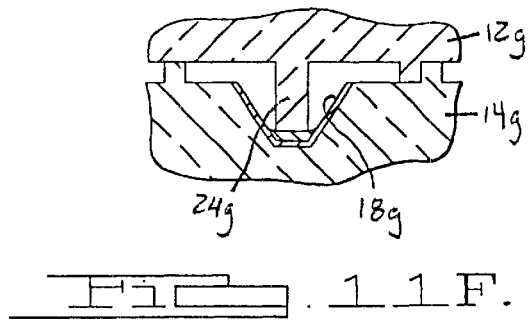

Turning to FIGS. 10a–10c, another embodiment of aligning the device 12f relative to the substrate 14f is illustrated. In this embodiment, the projection 24f takes the form of a large solder ball 32f. The solder ball projection 24f is first roughly aligned relative to the recess 18f. If desired, the solder ball projection 24f may then be prealigned using vibrating waves 34. Thereafter, a thermal cycle melts the solder ball projection 24f such that a bond is formed between the device 12f and substrate 14f.

Turning now to FIGS. 11a–11f, yet another alternate embodiment method of aligning the device 12g relative to the substrate 14g is illustrated. In this embodiment, mechanical stops 40 are provided on the substrate 14g adjacent the recesses 18g to trap the device 12g in a pre-selected area proximate the recess 18g. Upon application of the vibrating waves 34, the device 12g moves in a seemingly random pattern relative to the substrate 14g. After a period of time, the projection 24g falls into the recess 18g. The frequency, amplitude, and direction of the vibrating waves 34 is preferably optimized in order to increase process efficiency. As illustrated, the vibrating waves 34 preferably have various wave forms throughout the process.

Figure 12A:
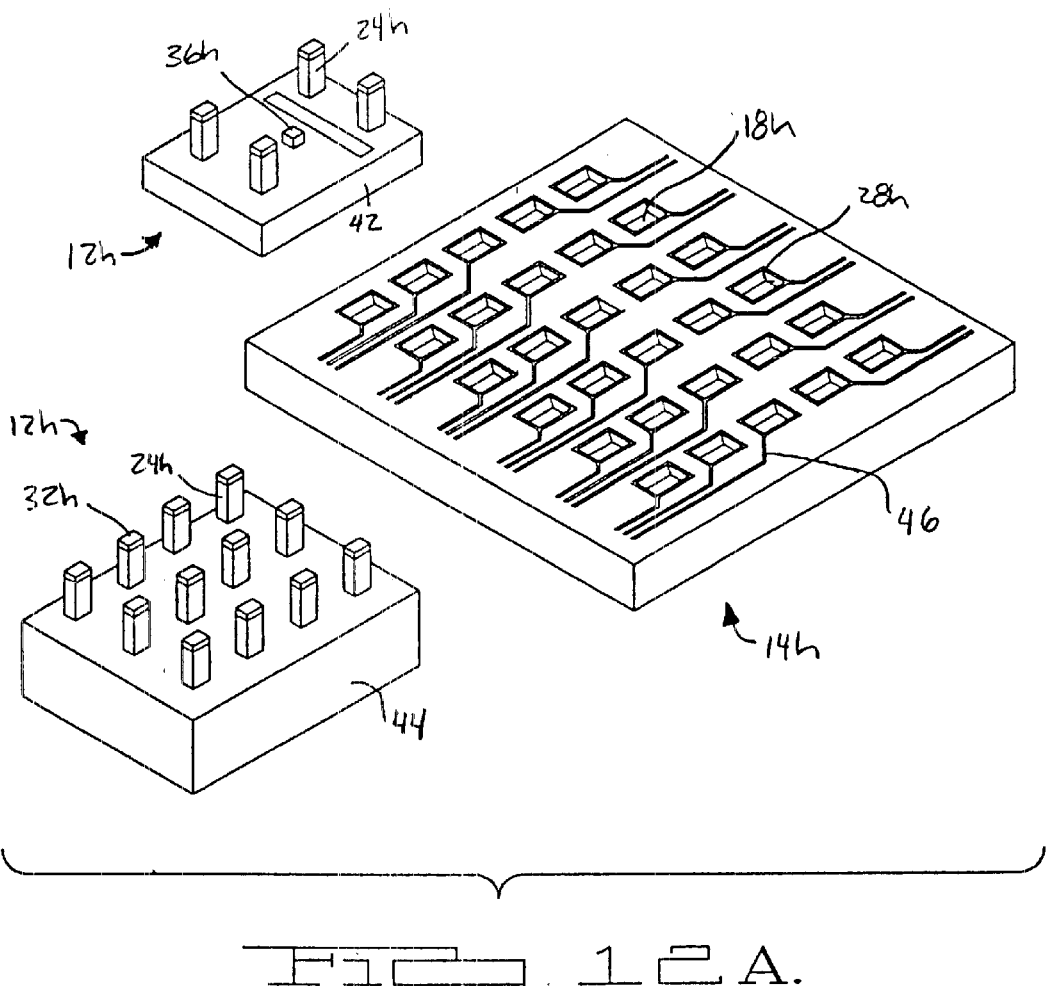
FIGS. 12a–12b illustrate a plurality of optoelectronic/photonic devices being secured to a universal substrate according to the present invention.
Figure 12B:
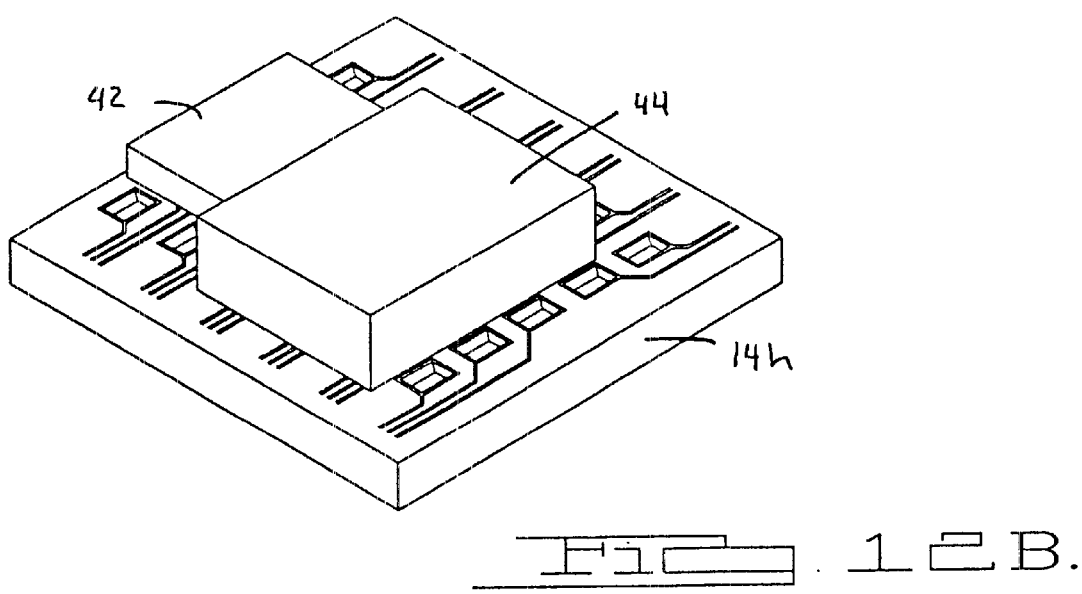

Referring now to FIGS. 12a–12b, another alternate embodiment of the present invention is illustrated. In this embodiment, a plurality of devices 12h including an active device 42 and a passive device 44 are secured to a single, universal substrate 14g. The active and passive devices 42, 44 may consist of, for example, lasers, waveguides, phasars, combiners, SOAs, photodiodes, among others. The active device 42 and passive device 44 are each provided with a plurality of projections 24h which are formed according to a pre-selected, standardized pattern. The active device 42 is also provided with an electrical pad 36h adjacent the projections 24h. Solder 32h is illustrated on each of the projections 24h.

The universal substrate 14g includes a plurality of recesses 18h formed therein according to a pre-selected, standardized pattern. Each recess 18h includes an angled wall 28h for capturing and directing a projection 24h. Each recess 18h may also be lined with a wetting material, if desired. Electrical pads 46 are deposited on the universal substrate 14h adjacent each recess 18h. Due to the standardized pattern of projections 24h and recesses 18h, the universal substrate 14h may be advantageously coupled to any device having a complementary set of projections.

Figure 13A:
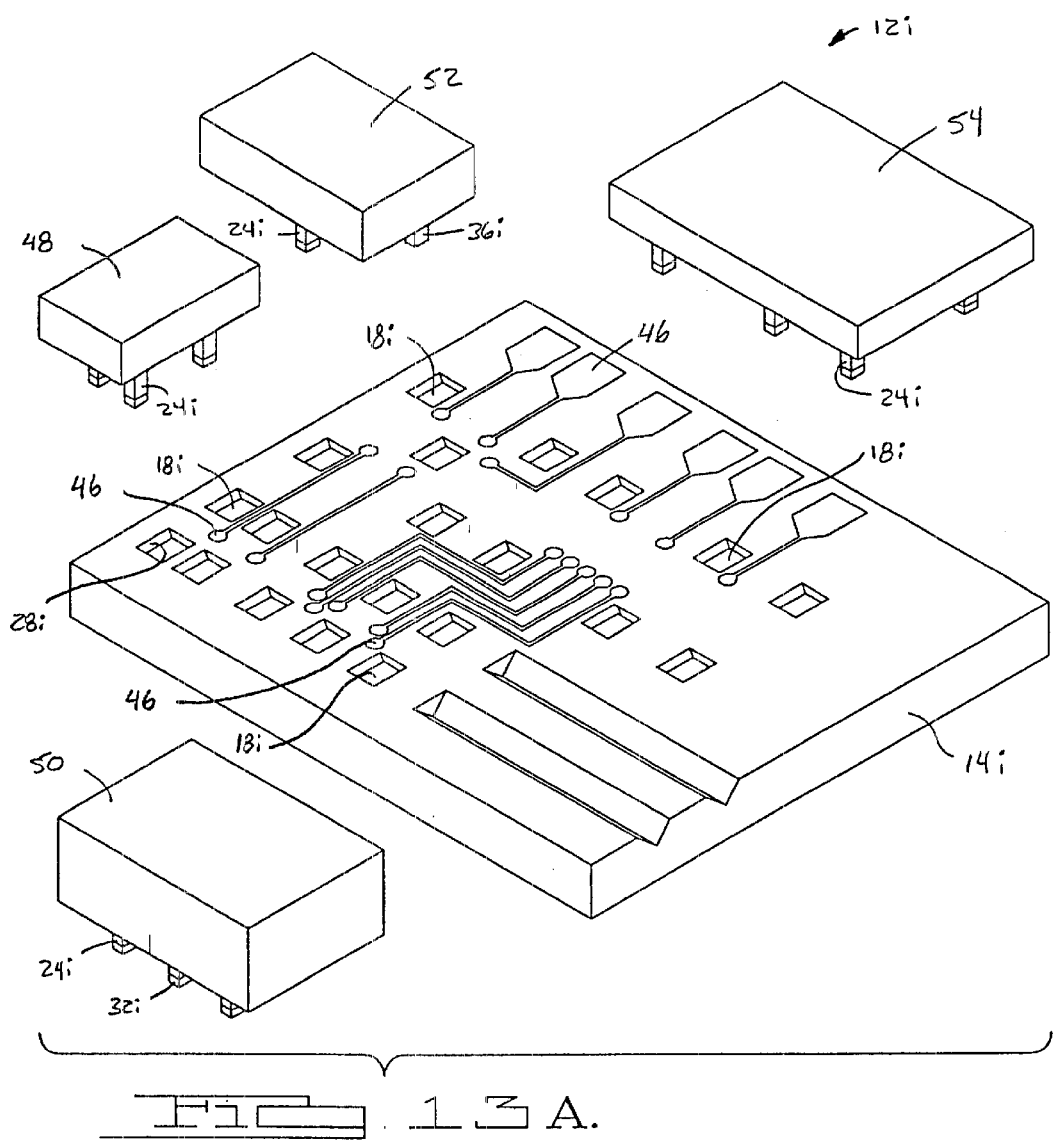
FIGS. 13a–13b illustrate a plurality of optoelectronic/photonic devices being secured to a customized substrate according to the present invention.
Figure 13B:
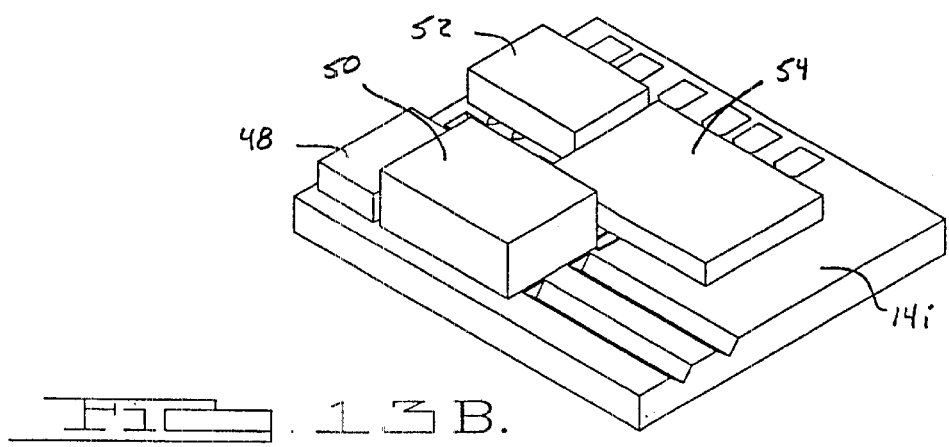

Referring now to FIGS. 13a–13b, yet another alternate embodiment of the present invention is illustrated. In this embodiment, a plurality of optoelectronic/photonic devices 12i are secured to a single, specifically designed substrate 14i. The devices 12i consist of a laser 48, a switch 50, a MMIC 52, and an ASIC 54, although other devices could substitute therefor. Each device 12I is provided with a plurality of projections 24i which are formed to a pre-selected pattern. Some of the devices 12i are provided with an electrical pad 36i adjacent the projections 24i. Solder 32i is illustrated on the projections 24i of the switch 50.

The substrate 14i includes a plurality of recesses 18i formed therein to compliment the arrangement of the projections 24i on each of the devices 12i. Each recess 18i includes an angled wall 28i for capturing and directing a projection 24i. Each recess 18i may also be lined with a wetting material, if desired. Electrical pads 46 are deposited on the substrate 14i to match the electrical pads 36i on the devices 12i. Due to the complimentary pattern of recesses 18i and projections 24i, a plurality of separate devices 12i may be coupled to a common substrate.

This embodiments illustrated in FIGS. 12A–13B may find particular usefulness in optical modules requiring a number of devices to be coupled to a single substrate. For example, such modules could include a transceiver with its photo diode, MMIC, isolator, filter, and laser chip on a common substrate, a cross-connect/phasar assembly, and a variable optical amplifier with its phasars disposed between an array of SOAs and photodiodes.

Thus, an apparatus and method are provided for aligning an optoelectronic/photonic device relative to a substrate. Either the device or substrate is provided with projections while the other is provided with complementary recesses. At least one of the projections and recesses is provided with angled walls for capturing and directing the other. Self-alignment is achieved using the surface tension of solder disposed between the device and substrate. If desired, vibrating waves may also be applied to the assembly to enhance alignment control.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. An apparatus comprising:
    a first chip including a plurality of bonding bumps formed thereon, said first chip also including a plurality of recesses formed therein at pre-selected locations relative to said plurality of bonding bumps;
    a second chip including a plurality of bonding pads formed thereon, said second chip also including a plurality of projections extending therefrom at pre-selected locations relative to said plurality of bonding pads; and
    a plurality of bonding members coupled between at least one of:
    said plurality of bonding bumps and said plurality of bonding pads; and
    said plurality of projections adjacent said plurality of recesses;
    wherein at least one of said plurality of recesses and said plurality of projections includes angled walls for capturing and directing the other of said plurality of recesses and said plurality of projections during reflow of said bonding members such that said first chip aligns relative to said second chip; and
    wherein said plurality of projections further comprise one of a plurality of conical and pyramidal members.

2. The apparatus of claim 1 wherein said plurality of recesses further comprise one of a plurality of conical, pyramidal, and curved depressions.

3. The apparatus of claim 1 wherein said plurality of projections further comprise at least a portion of said plurality of bonding members.

4. The apparatus of claim 1 further comprising a wetting material interposed between said first chip and said second chip adjacent said plurality of recesses.

5. The method of claim 1 further comprising applying vibrating waves to said first and second chips during said reflow to assist movement of said plurality of projections relative to said plurality of recesses.

6. (original) The method of claim 5 wherein said vibrating waves further comprise one of acoustic and ultra-sonic waves.

7. A method of interconnecting a pair of chips comprising:
    providing a first chip;
    forming a plurality of recesses in said first chip at pre-selected locations;
    providing a second chip;
    forming a plurality of projections on said second chip at pre-selected locations relative to said plurality of recesses;
    positioning said plurality of projections proximate said plurality of recesses; and
    applying vibrating waves to said first and second chips to move said first chip relative to said second chip until said plurality of projections enter said plurality of recesses.

8. The method of claim 7 wherein said vibrating waves further comprise one of acoustic and ultra-sonic waves.

9. The method of claim 7 wherein a frequency and amplitude of said vibrating waves is selected to match a geometry of said first and second chips.

10. The method of claim 7 wherein at least one of a frequency and amplitude of said vibrating waves is varied as said first chip moves relative to said second chip.

11. The method of claim 7 further comprising:

depositing a bonding material between said first and second chips;

melting said bonding material during said step of applying said vibrating waves such that said first chip is free to move relative to said second chip; and cooling said bonding material after said plurality of projections enter said plurality of recesses.

12. The method of claim 7 wherein at least one of said plurality of projections and said plurality of recesses includes angled walls for capturing and directing the other of said plurality of recesses and said plurality of projections.

13. The method of claim 7 wherein said step of forming said plurality of projections further comprises forming at least one of a plurality of conical and pyramidal projections.

14. The method of claim 7 wherein said step of forming said plurality of recesses further comprises forming at least one of a plurality of conical and curved depressions.

15. The method of claim 7 further comprising interposing a wetting material between said first chip and said second chip adjacent said plurality of recesses.

16. A method of mechanically and electrically interconnecting an optoelectronic device with an optical component supporting substrate comprising:

forming a plurality of bonding bumps on said device;

forming a plurality of recesses in said device at preselected locations relative to said bonding bumps;

forming a plurality of bonding pads on said substrate;

forming a plurality of projections on said substrate at pre-selected locations relative to said bonding pads;

coupling a plurality of bonding members to at least one of said plurality of bonding bumps and said plurality of bonding pads;

positioning said device on said substrate such that said bonding members are proximate at least one of said plurality of recesses; and said plurality of projections;

melting said plurality of bonding members such that said device is free to move relative to said substrate due to a surface tension of said plurality of bonding members and frictional interference of said plurality of projections and said plurality of recesses;

applying vibrating waves to said device and said substrate during said melting step to assist movement of said plurality of projections relative to said plurality of recesses and cooling said plurality of bonding members;

wherein at least one of said plurality of projections and said plurality of recesses includes angled walls for capturing and directing the other of said plurality of recesses and said plurality of projections during reflow of said plurality of bonding members such that said device aligns relative to said substrate.

17. The method of claim 16 further comprising interposing a wetting material between said device and said substrate adjacent said plurality of recesses.

18. The method of claim 16 wherein said angled walls are slanted or curved.

* * * * *